United States Patent
O'Neill et al.

(10) Patent No.: US 7,541,611 B2
(45) Date of Patent: Jun. 2, 2009

(54) APPARATUS USING MANHATTAN GEOMETRY HAVING NON-MANHATTAN CURRENT FLOW

(75) Inventors: Thomas G. O'Neill, Mountain View, CA (US); Robert J. Bosnyak, Tacoma, WA (US)

(73) Assignee: Sun Microsystems, Inc., Santa Clara, CA (US)

( * ) Notice: Subject to any disclaimer, the term of this patent is extended or adjusted under 35 U.S.C. 154(b) by 184 days.

(21) Appl. No.: 11/339,003

(22) Filed: Jan. 24, 2006

(65) Prior Publication Data

US 2007/0170473 A1 Jul. 26, 2007

(51) Int. Cl.
*H01L 23/58* (2006.01)
*H01L 21/66* (2006.01)

(52) U.S. Cl. ............... 257/48; 257/E21.521; 438/14

(58) Field of Classification Search ............. 257/213, 257/288, E29.12, 48, E21.521; 438/14, 17, 438/18

See application file for complete search history.

(56) References Cited

U.S. PATENT DOCUMENTS 5,682,048 A * 10/1997 Shinohara et al. ......... 257/342
6,365,947 B1 * 4/2002 Vollrath et al. ............ 257/401
2004/0238897 A1 * 12/2004 Oishi ....................... 257/369

OTHER PUBLICATIONS

D.A. Bittle et al., "Piezoresistive Stress Sensors for Structural Analysis of Electronic Packages", Journal of Electronic Packaging, Sep. 1991, p. 203, vol. 113, Auburn Alabama, 13 pages.
C. Jaeger et al., "Effects of Stress-Induced Mismatches on CMOS Analog Circuits," Proceedings of the 1995 International VLSI TSA Symposium, 1995, 354, Taipei, Taiwan, 7 pages.
L. A. Glasser & Daniel W. Dobberpuhl, "The Design and Analysis of VLSI Circuits", 1985, Addison-Wessley Longman, Boston, Chapters 1-5, 329 pages.

* cited by examiner

*Primary Examiner*—Evan Pert
*Assistant Examiner*—Kevin Quinto
(74) *Attorney, Agent, or Firm*—Osha • Liang LLP

(57) ABSTRACT

A device is described, including a first diffusion region having a first terminal, a second diffusion region having a second terminal, and a channel region disposed between the first diffusion region and the second diffusion region. Further, the first terminal and the second terminal are offset to enable a non-Manhattan current flow. A system is also described, including the previously described device and a second transistor. The pathway for the flow of the majority of the current carriers in the device defines a first direction. The second transistor also has at least two terminals, and a pathway for a majority of current carriers between the two terminals defines a second direction. The angle between the first direction and the second direction is nonzero and acute.

6 Claims, 5 Drawing Sheets

APPARATUS USING MANHATTAN GEOMETRY HAVING NON-MANHATTAN CURRENT FLOW

STATEMENT REGARDING FEDERALLY SPONSORED RESEARCH OR DEVELOPMENT

This invention was made with United States Government support under contract NBCH020055 awarded by the Defense Advanced Research Projects Agency. The United States Government may have certain rights in the invention.

BACKGROUND

Thermal and mechanical stresses on silicon substrates may lead to operational or mechanical failures of devices constructed using those silicon substrates. Typical stresses include mechanical loading due to the packaging of the devices, thermal loading due to heat generated by circuits within those devices through power dissipation, and stresses applied to materials in close proximity to the devices. These stresses may lead to mechanical failure of the devices and/or mechanical failure of the material in close proximity to the devices. The larger the stress, the higher the chance for mechanical and/or circuit failure.

Typically, to be able to determine the stress imposed on a silicon substrate at a given location, two differential pairs of transistors are formed at that location. In order to determine the magnitude stress in two dimensions, it is necessary to (i) measure individual current flows through the two pairs of transistors and (ii) compare the measured current flows in each pair against values previously determined when exerting known stresses on the substrate. The comparison of the current flows and the previously determined values may be done by a stress computer.

Each pair of transistors is oriented so that pathways defined by their individual majority current flows across their respective channel regions are nonparallel. Ideally, the current flows associated with the two transistors define pathways that form a right angle. Further, in an ideal stress measurement system, it is desired that the right angle axes for the first pair of transistors be oriented 45 degrees off angle from the right angle axes for the second pair of transistors. Thus, for example, an x-axis associated with the first pair of transistors is ideally rotated 45 degrees from the x-axis associated with the second pair of transistors. This makes the y-axis for the first pair offset from the y-axis of the second pair, assuming both pairs of axes are right angles.

Manhattan geometry rules are often used when transistors are designed. Those rules require that the edges of various transistor building blocks making up the transistors be parallel to one of either the X or the Y axis of a coordinate system associated with the silicon substrate on which the transistors are formed. Such building blocks include the source and drain diffusion regions and terminal areas, the gate polysilicon region, the channel region, the oxide between the gate and the channel region, etc.

FIG. 1 is a block diagram of a prior art metal oxide silicon transistor. Transistor 102 is formed on substrate 104 and includes diffusion regions 106 and 108. Diffusion regions 106 and 108 each have respective silicide layers (not shown) which lowers the resistance of associated diffusion regions 106 and 108. Diffusion regions 106 and 108 may be p-type regions, n-type regions, or similar type regions well known in the art. Those skilled in the art will appreciate in an n-type diffusion region, the density of electrons in the conduction band exceeds the density of holes in the valence band. Those skilled in the art will appreciate in a p-type diffusion region, the density of holes in the valence band exceeds the density of electrons in the conduction band. Polysilicon gate 110 is formed over a thin oxide layer 112 insulating it from channel 114.

Metal contacts (not shown) are typically bonded to diffusion regions 106 and 108 and to gate 110 in order to facilitate the application of voltages between the various component parts and thus operate the device. Typically, a voltage is applied between diffusion areas 106 and 108, with an adjustable control voltage being applied to gate 110. Current will flow through channel region 114 if the voltage on the gate contact is greater than a threshold voltage.

Because the diffusion regions 106 and 108 are generally of relatively uniform resistance, current carriers leave one diffusion anywhere along its length and pass through the channel region 114 into the other diffusion region, following a path of least resistance. Thus, the pathways followed by those current carriers is typically a straight line from the edge of one of the diffusion regions to the nearest point on the other diffusion region.

Persons of ordinary skill in the art readily recognize that such pathways are along one coordinate axis of the coordinate system used when laying out the circuitry to be disposed on the substrate. Such a current flow is termed "Manhattan" current flow because the current flow is along one of the coordinate axes.

In a stress measurement system, Manhattan geometry rules may be used to produce the first of two pairs of transistors. However, the second pair of transistors needs to have a current flow that is non-Manhattan (not along a coordinate axis). Thus, the second pair of transistors needs to have a current flow that is not parallel to a coordinate axis, thus typically requiring that the second pair of transistors be implemented using non-Manhattan rules.

SUMMARY

In one aspect of one or more embodiments of the present invention, a device is described, including a first diffusion region having a first terminal, a second diffusion region having a second terminal, wherein at least one of the first diffusion region and the second diffusion region has a resistance greater than an effective resistance of the device, and a channel region disposed between the first diffusion region and the second diffusion region. Further, the first terminal and the second terminal are offset to enable a non-Manhattan current flow.

In one aspect of one or more embodiments of the present invention, a system is described, including a first transistor and a second transistor. The first transistor includes a first diffusion region having a first terminal, a second diffusion region having a second terminal, wherein at least one of the first diffusion region and the second diffusion region has a resistance greater than an effective resistance of the device, a channel region disposed between the first diffusion region and the second diffusion region, wherein the first terminal and the second terminal are offset to enable a non-Manhattan current flow.

Other aspects and advantages of the invention will be apparent from the following description and the appended claims.

DETAILED DESCRIPTION

Figure 1:
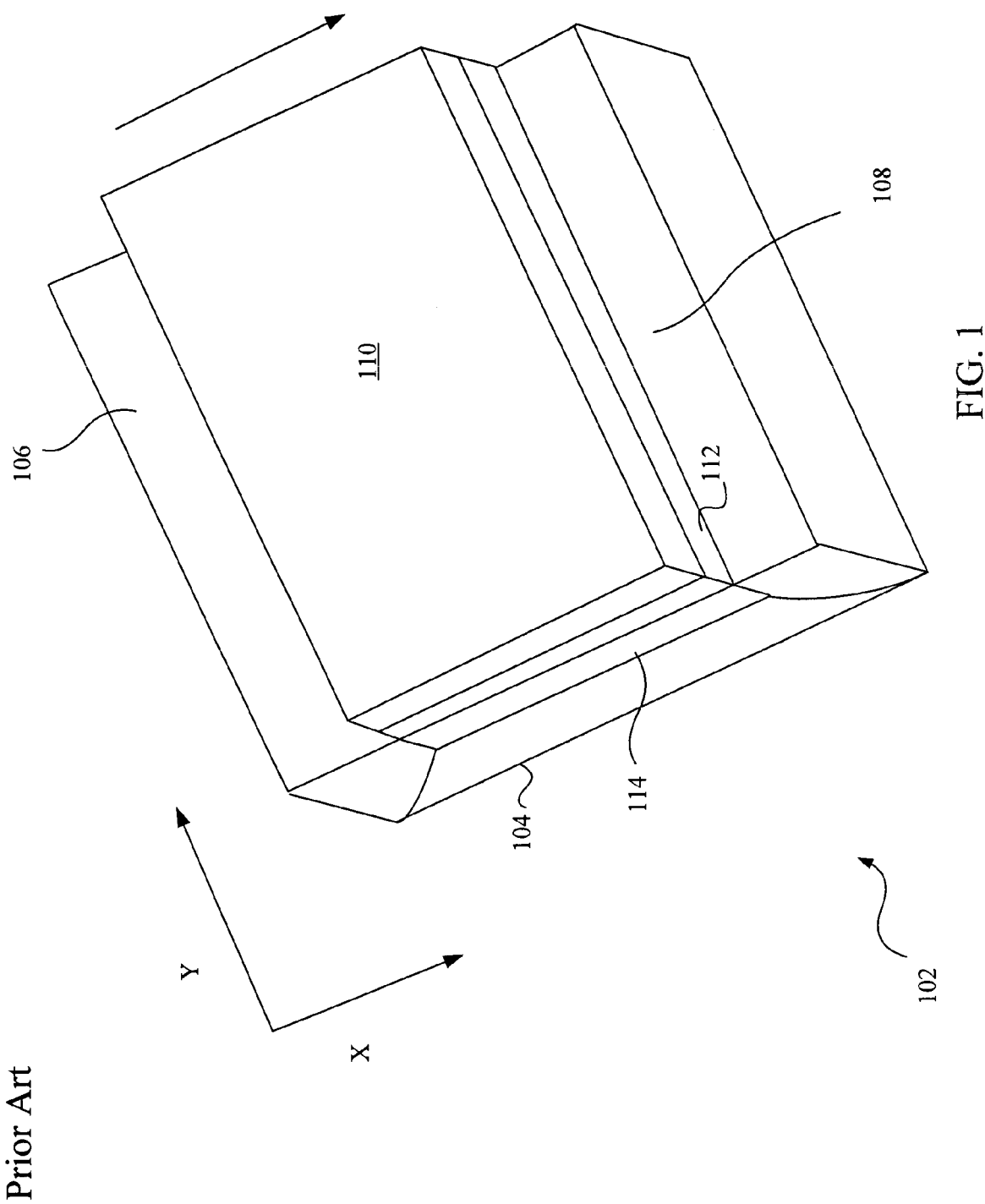
FIG. 1 is a block diagram of a prior art metal-oxide silicon transistor.

Exemplary embodiments of the invention will be described with reference to the accompanying drawings. Like items in the drawings are shown with the same reference numbers.

In one or more embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the invention.

In general, embodiments of the invention relate to transistor designs created using Manhattan geometry. More particularly, a transistor is described that is designed using Manhattan geometry, where a majority of current carriers flow in a non-Manhattan manner between source and drain terminals of the transistor.

In one or more embodiments of the invention, a transistor design includes a source terminal and a drain terminal each disposed on top of respective diffusions regions. The diffusion regions are disposed on either side of a gate region. Each diffusion region has a terminal which is connected to that diffusion region at a point where a silicide process has been applied, thus lowering the resistance of the contact area between the terminal and the diffusion region.

Figure 2:
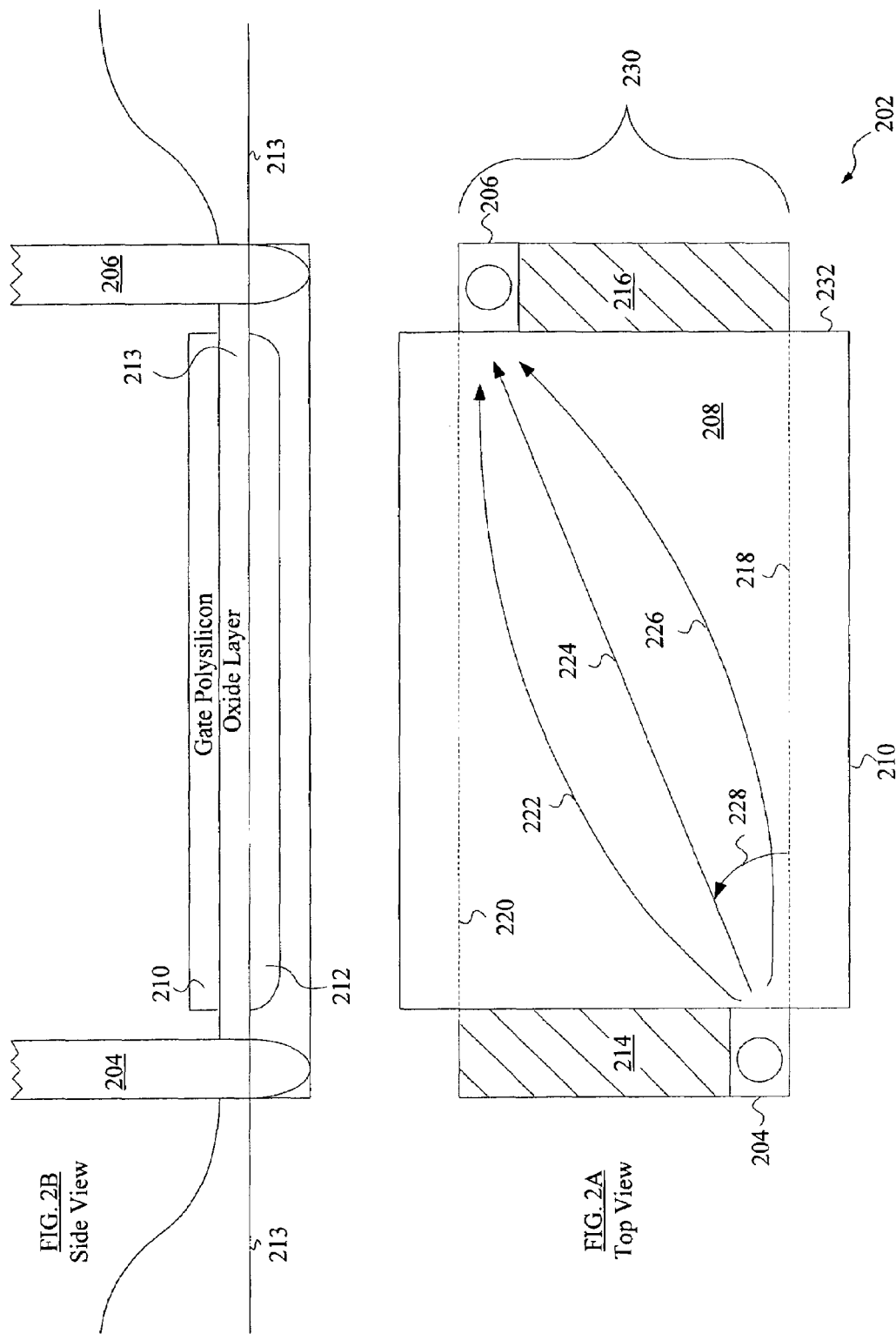
FIGS. 2A and 2B are a block diagram showing the layout of a transistor according to one or more embodiments of the invention.

FIGS. 2A and 2B are a block diagram showing the layout of a transistor according to one or more embodiments of the invention.

Transistor 202 includes a first terminal 204 and a second terminal 206 each disposed at opposite diagonal corners of a region 208. Region 208 is an area of overlap by a gate layer 210 over a channel region 212. Persons of ordinary skill in the art are readily aware of how to create gate layers, channel regions, and diffusion regions. A thin oxide layer 213 is disposed between channel region 212 and gate layer 210 in order to prevent direct contact between them. In one or more embodiments of the invention, at least one of the diffusion regions has a resistance greater than an effective resistance of the transistor.

When forming a terminal such as terminal 204 or terminal 206, a metal layer is selectively disposed over portions of a diffusion region and then superheated through a process called annealing. This annealing process causes the metal to bond with the diffusion region thus lowering the resistance (and increasing the conductivity) of those annealed areas. As persons of ordinary skill in the art will readily understand, the metal and silicon compound formed during the annealing process is called silicide.

Areas where it would not be desirable to apply the metal layer prior to annealing receive a silicide block instead. Applying the silicide block prevents the application of metal in those areas, and increases the resistance of those areas receiving the block. Areas having higher resistance are much less likely to exhibit current flow, provided that lower resistance regions are available.

Areas 214 and 216 are optional areas where it is convenient to implant a silicide block. Although these portions will be subjected to the annealing process, there is no metal to anneal. In order to minimize the number of current carriers that flow from terminal 204 through area 214 and then directly to terminal 206, areas 214 and 216 are blocked from the application of metal using what is known to those of ordinary skill as a silicide block. By using a silicide block on areas 214 and 216, the areas defined as terminals 204 and 206 provide a significantly greater contribution to the flow of current carriers through transistor 202 as compared to areas 214 and 216.

By blocking the application of metal to those areas prior to annealing, areas 214 and 216 have a greater resistance than that of terminals 204 and 206 respectively.

Terminal 204 is disposed so that it is offset from terminal 206. That is, a line drawn between the center of the area covered by terminal 204 and the center of the area covered by terminal 206 forms a nonzero acute angle with the top 220 or bottom edges 218 of channel region 208. In one or more embodiments of the invention, low conductivity region 214 begins at a point fifty percent or less of the distance between the bottom 218 and top 220 of diffusion region 208. Terminal 206 is disposed so that low conductivity region 214 begins at a point 50 percent or less of the distance between the top 220 and bottom 218 of diffusion region 208. Forming the terminals 204 and 206 in this manner ensures that there is an angular (non-Manhattan) component to the average pathway the current carriers follow between terminals 204 and 206.

Because current carriers are most likely to take a path of least resistance, they follow the shortest path between two points, assuming the region they are traveling through has a relatively uniform resistance. Thus, most of the charge carriers follow paths largely similar to pathways 222, 224, and 226. The current flows as shown due to the relatively high resistance of the diffusion regions. In other words, current tends to flow from terminal contact to terminal contact instead of from terminal to associated diffusion region, across channel to other diffusion region to other terminal. Averaging the pathways, the primary direction for the current flow approximates an angle 228 formed by average pathway 224 and edge 218 of channel region 208.

In some applications, it may be desirable for angle 228 to be approximately 45 degrees. As those of ordinary skill in the art having the benefit of this disclosure will be readily aware, angle 228 will approximate 45 degrees when length 230 (the height of the rectangular diffusion region from edge 218 to edge 220) is approximately the same as the length as edge 220, both of diffusion layer 212. Other angles may be created, as desired, using the appropriate ratio of edge 220 and length 230.

Figure 3:
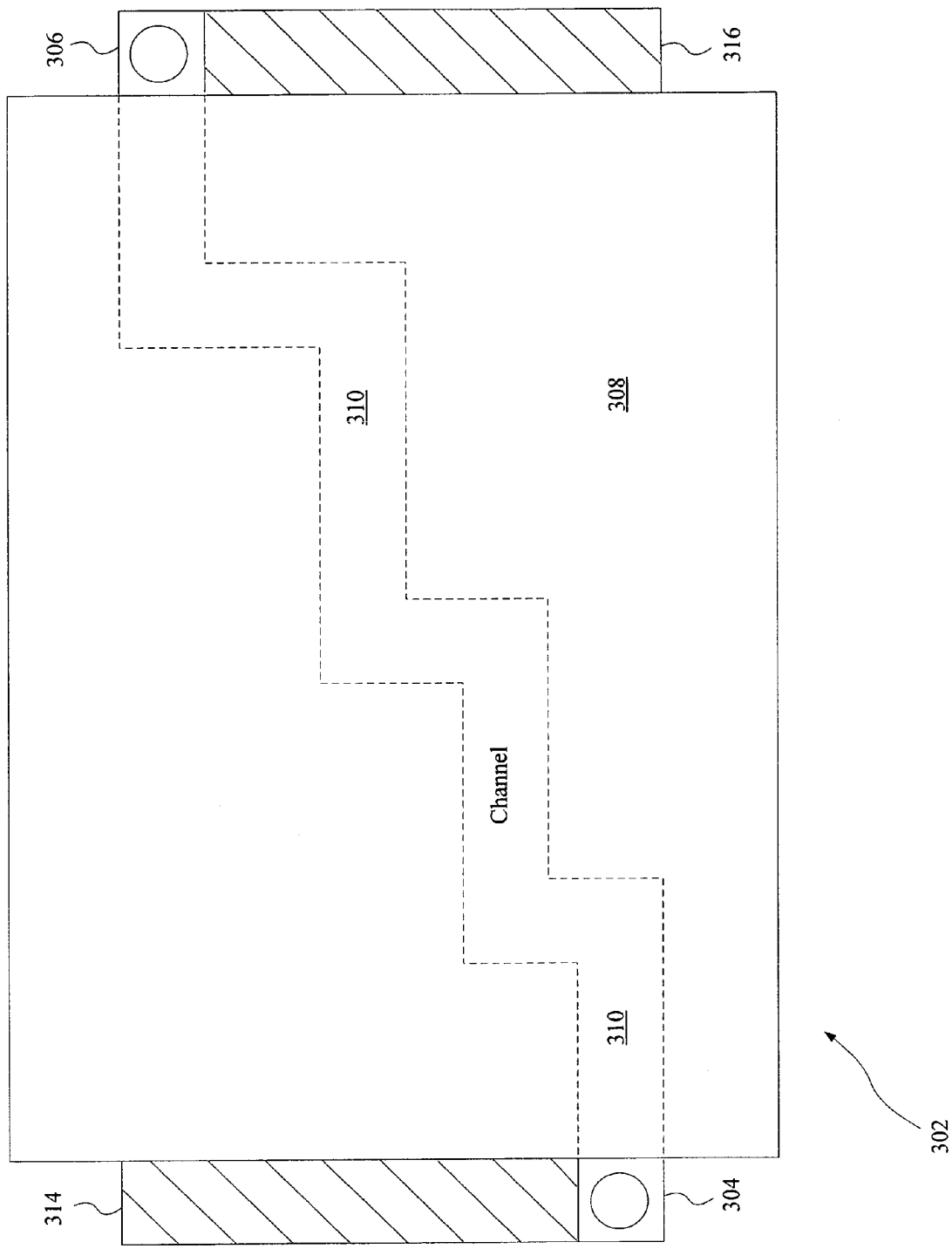
FIG. 3 is a block diagram showing the layout of a transistor according to one or more embodiments of the invention.

FIG. 3 is a block diagram showing the layout of a transistor according to one or more embodiments of the invention.

Transistor 302 includes a first terminal 304 and a second terminal 306 each disposed at opposite edges of a gate 308. Gate 308 overlaps stairstep channel region 310. Persons of ordinary skill in the art are readily aware of how to create gate and diffusion regions. The side view of transistor 302 is the same as shown in FIG. 1B.

The primary differences between FIG. 3 and FIG. 2A include the shape of the channel region 310 and restrictions on the size of terminals 204 and 206 as compared to the lack of a size restriction for terminals 304 and 306. In FIG. 2A, channel region 212 is rectangular. In order to ensure that the average pathway for current carriers between terminal 204 and 206 is at an angle 228, terminals 204 and 206 are restricted as to their placement and size.

With the FIG. 3 channel region being stair-stepped and thus restricting the pathways of the current carriers, on average, to the desired angle through the limited deposition of channel materials, restrictions on the placement and the size of terminals 304 and 306 may be relaxed as compared to restrictions placed on terminals 204 and 206. Thus, in the embodiments of FIG. 3, terminals 304 and 306 need only be in contact with the diffusion region at opposite edges of the area of overlap between channel region 310 and gate 308.

Areas 314 and 316 are areas where it may be convenient to use a doping process to implant diffusion materials into portions of the silicon substrate. Areas 314 and 316 are optionally blocked from the application of the metal layer using what is known to those of ordinary skill as a silicide block. By using a silicide block, the areas defined as terminals 304 and 306 provide a significantly greater contribution to the flow of current carriers through transistor 302 as compared to areas 314 and 316. However, because the current flow pathway is largely influenced by the stair-step pattern of channel region 310, the shape of the terminals 304 and 306 has less affect on the path of the current carriers.

Figure 4:
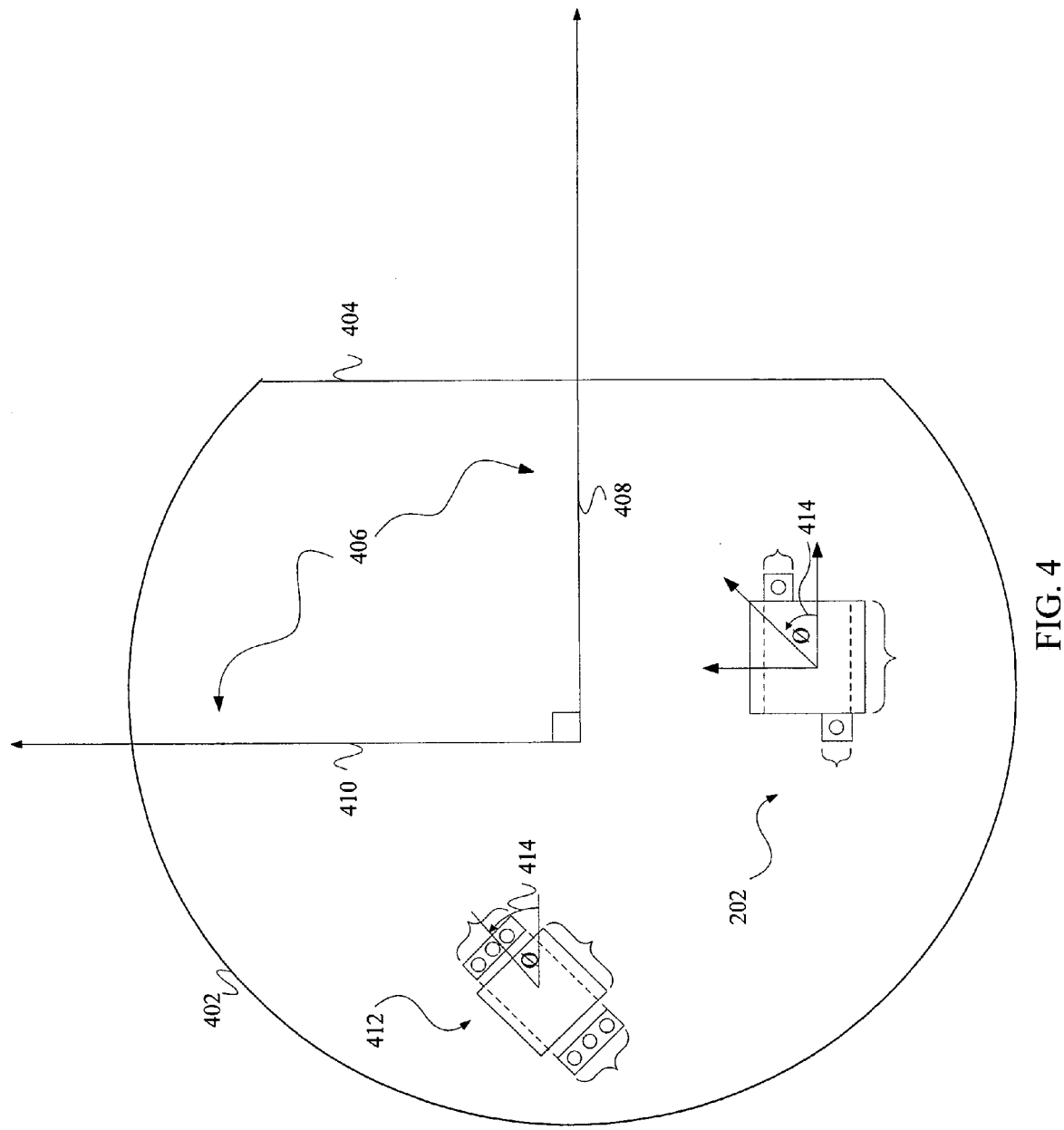
FIG. 4 shows a transistor placed on a silicon wafer according to one or more embodiments of the present invention.

FIG. 4 shows a transistor placed on a silicon wafer according to one or more embodiments of the present invention.

Transistors such as transistor 202 are typically formed on a substrate such as substrate 402. Although silicon is typically used as a substrate material, persons of ordinary skill in the art having the benefit of this disclosure will readily recognize that other substrates may also be suitable for the practice of the invention.

Often, there is a flat edge such as edge 404 associated with a silicon substrate (which, in this form, is commonly called a wafer) which is used for orientation purposes when disposing transistors and other devices on substrate 402. When disposing devices on a substrate, a coordinate system such as coordinate system 406 having x-axis 408 and y-axis 410 is often superimposed as an overlay on a representation of a wafer, to ensure that devices are allowed to be deposited, based on system rules that are imposed depending on the deposition process used to deposit the materials needed to create the various devices. Although not required, flat edge 404 may be used to orient the axes of coordinate system 406 with respect to substrate 402.

Prior to laying out a transistor design or other device for later deposition onto a silicon or other substrate, the process that is used to deposit the correct materials onto the substrate is determined. That process is typically associated with a set of design rules that, when followed, are guaranteed to result in working devices. The failure to follow one or more of the design rules specified for a given process does not necessarily result in a non-working device, but the process is not typically guaranteed to work when depositing devices not following those rules.

One common rule associated with processes that are known to persons of ordinary skill in the art requires the use of Manhattan geometry. Manhattan geometry rules typically require that all edges of a deposited device be within a few degrees of being parallel to one of either the x-axis or the y-axis of the superimposed coordinate system 406. If a coordinate system is not employed, the same Manhattan geometry rule imposes a parallelism/90-degree rule which requires that each edge be either parallel or perpendicular to all other edges on the wafer.

Typical complementary metal oxide semiconductor (CMOS) transistors have a current flow from a source terminal to a drain terminal, along a pathway defined by a rectangular channel region controlled by a gate terminal. In some prior art designs such as that seen with transistor 412, in order to achieve an off axis current flow, transistors have been laid out at an angle 414 other than zero degrees or 90 degrees, in violation of Manhattan geometry requirements. Violating Manhattan geometry rules, like violations of other design rules that may be imposed by the process being used, imposes a risk that one or more devices laid out in the violating manner may not function properly. Thus, it is risky to use such techniques to get an off-axis (i.e., non-Manhattan) current flow.

In one or more embodiments of the invention, transistor 202 is disposed on substrate 402 using Manhattan geometry rules. As previously discussed, transistor 202 provides non-Manhattan current flow for applications requiring off-axis current flow.

In order to measure stress on a substrate, two pairs of transistors are disposed on the substrate. By monitoring the relationships of the current flows through the two pairs of transistors and comparing those current flows with known values, the location and magnitude of the stress may be determined. In one embodiment of the invention, a stress computer is used to determine the location and magnitude of the stress by comparing the current flows. A stress computer may be a typical computer well known in the art with specialized software for performing calculations and comparisons for determining the location and magnitude of a stress.

Figure 5:
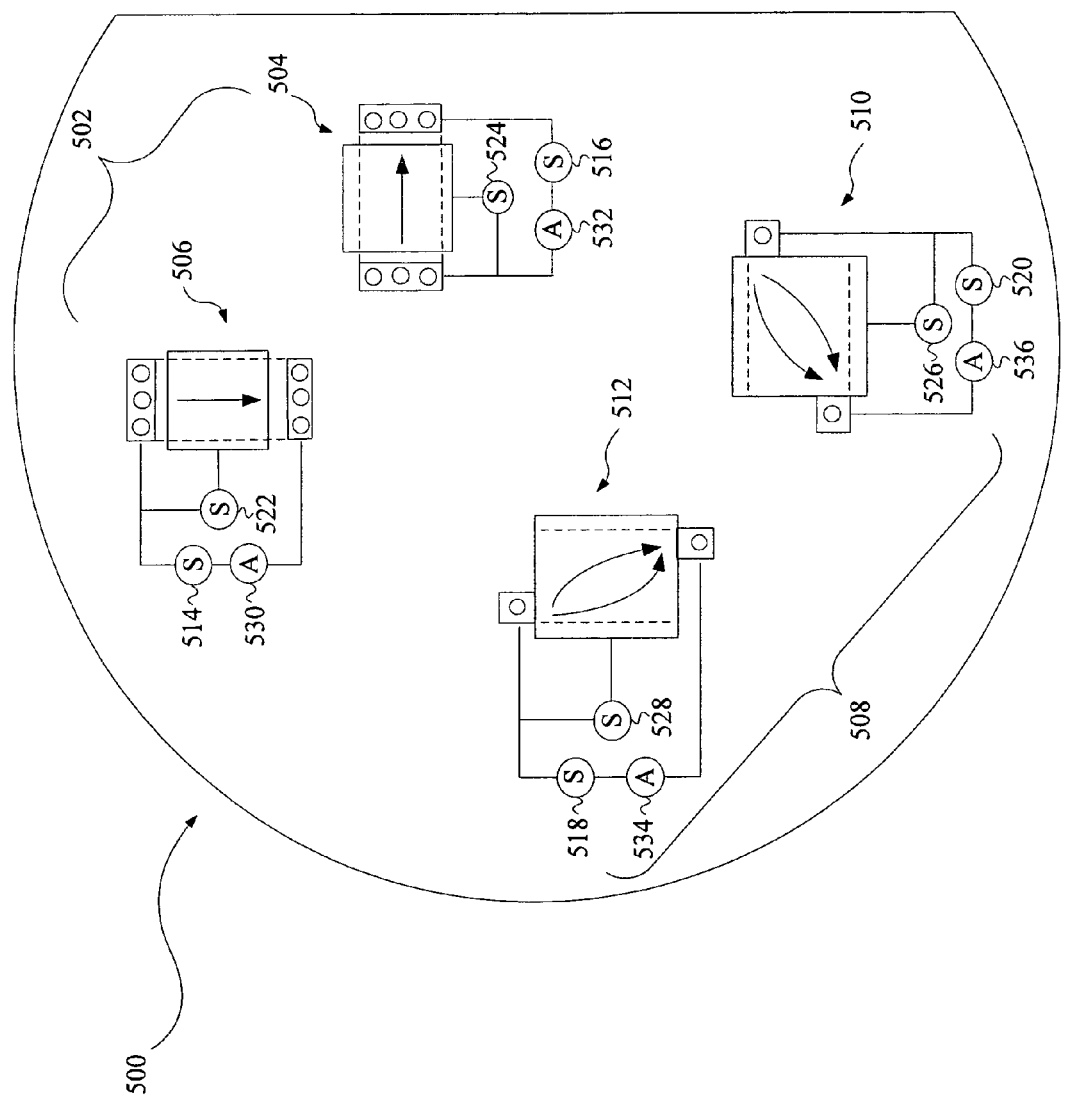
FIG. 5 is a representative layout of a stress measurement system according to one or more embodiments of the invention.

FIG. 5 is a representative layout of a stress measurement system according to one or more embodiments of the invention.

System 500 includes a first transistor pair 502 including transistors 504 and 506, and second transistor pair 508 including transistors 510 and 512. Persons of ordinary skill in the art having the benefit if this disclosure will readily recognize that transistor pair 502 and transistor pair 508 may be used to determine the stress on the substrate in the vicinity of those transistor pairs. Those skilled persons will readily understand that transistors must be biased to turn on using power sources such as sources 514, 516, 518, and 520, and sources 522, 524, 526, and 528.

Those skilled persons will further recognize that current through those transistors may be measured using ammeters 530, 532, 534, and 536. By comparing the magnitude of the current through each device with known values that represent different stress levels, the magnitude of stress on the substrate may be determined.

Persons of ordinary skill in the art having the benefit of this disclosure will readily recognize that the invention allows transistors designs to utilize desirable Manhattan geometry rules, while also achieving off-axis current flow for situations needing the off-axis current. Such an advantage ensures that systems such as the stress measurement system described herein to be manufactured with a high degree of confidence that the process will produce working devices.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for measuring stress, comprising:
   a first transistor comprising:
      a first diffusion region having a first terminal;
      a second diffusion region having a second terminal; and
      a channel region disposed between the first diffusion region and the second diffusion region, wherein only a portion of the first diffusion region and only a portion of the second diffusion region borders the channel region, wherein the first transistor channel region has a stair-step shape, wherein at least one of the first diffusion region and the second diffusion region has a resistance greater than an effective resistance of the first transistor, wherein the first terminal and the second terminal are offset to enable a non-Manhattan current flow, and wherein a first pathway for a majority of current carriers between the first terminal and the second terminal defines a first direction;

a second transistor comprising:

a third diffusion region having a third terminal; and a fourth diffusion region having a fourth terminal, wherein a second pathway for a majority of current carriers between the third terminal and the fourth terminal defines a second direction, and wherein an angle between the first direction and the second direction is nonzero and acute;

at least one ammeter to measure the non-Manhattan current flow and a second current flow between the third terminal and the fourth terminal of the second transistor; and a stress computer for determining a magnitude of a stress on a substrate by comparing the non-Manhattan current flow and the second current flow.

2. The system of claim 1, wherein the first transistor and the second transistor are disposed in accordance with Manhattan geometry rules.

3. The system of claim 1, wherein at least one selected from the group consisting of the first diffusion region, the second diffusion region, the third diffusion region and the fourth diffusion region is a p-type region.

4. A method of measuring stress comprising:

measuring a non-Manhattan current flow in a first transistor comprising a first terminal offset from a second terminal to enable the non-Manhattan current flow;

measuring a second current flow in a second transistor comprising a third terminal and a fourth terminal, wherein a first pathway for a majority of current carriers between the first terminal and the second terminal define a first direction, wherein a second pathway for a majority of current carriers between the third terminal and the fourth terminal defines a second direction, and wherein an angle between the first direction and the second direction is nonzero and acute; and comparing the non-Manhattan current flow and the second current flow to determine the stress.

5. The method of claim 4, wherein the non-Manhattan current flow is measured using an ammeter.

6. The method of claim 4, wherein the comparing the non-Manhattan current flow and the second current flow is performed using a stress computer.

* * * * *